Sept. 4, 1962 R. GOLDSTEIN 3,052,855
VARIABLE EXCITATION MODULATOR
Filed Dec. 4, 1958
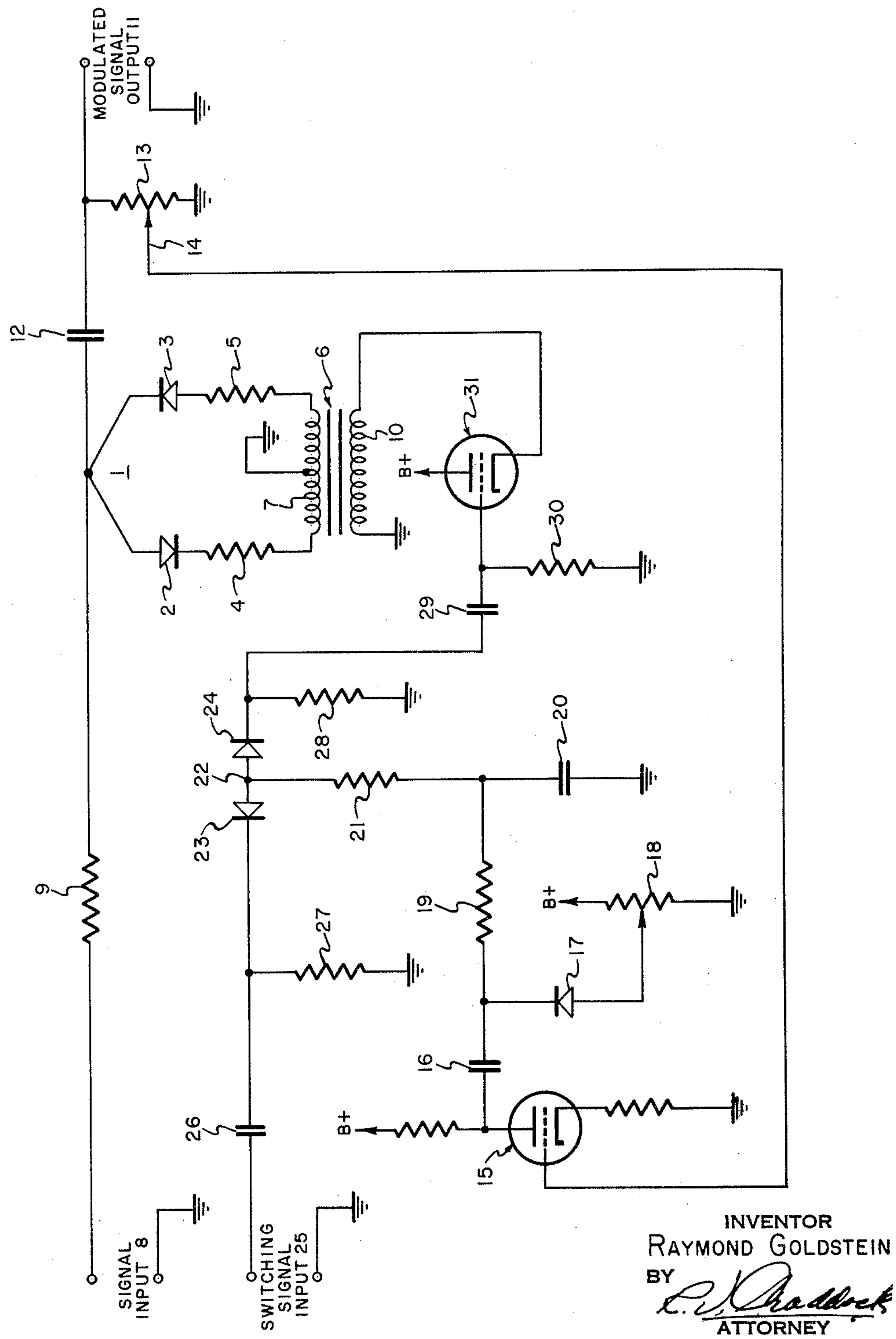
INVENTOR
RAYMOND GOLDSTEIN
BY
ATTORNEY United States Patent Office 3,052,855

Patented Sept. 4, 1962

3,052,855

VARIABLE EXCITATION MODULATOR

Raymond Goldstein, Phoenix, Ariz., assignor to Sperry Rand Corporation, Great Neck, N.Y., a corporation of Delaware Filed Dec. 4, 1958, Ser. No. 778,260

4 Claims. (Cl. 332—37)

The present invention relates to signal modulating circuits and, more particularly, to modulating circuits of the switching type.

A common modulating circuit of the switching type employs diode elements as electronic switches which alternately connect and disconnect an input signal to a pair of output terminals. As is well understood in the art, in order to make the modulating circuit relatively insensitive to amplitude variations in the excitation or switching signal which controls the conduction and nonconduction of the diode elements, it is necessary that the switching signal amplitude be several times greater than the maximum input signal amplitude. The usual practice is to make the switching signal amplitude at least five times greater than the maximum input signal amplitude. It will be recognized that when the switching signal amplitude is thus fixed, the ratio of switching signal amplitude to input signal amplitude increases when the amplitude of the input signal decreases.

The operation of the switching modulating circuit in response to low amplitude input signals is of special interest in null-seeking electronic servo mechanisms when the input signal of interest (servo error signal) is reduced toward zero amplitude during normal operation. It is important that no spurious output be produced by the modulating circuit when the amplitude of the input signal is zero. Accordingly, the modulating circuit is designed so that it is "balanced" with respect to the switching signal input, i.e., so that no output is produced in the sole presence of the switching signal.

More or less elaborate provisions may be made to establish balance with respect to the switching signal. However, despite the attainment of initial balance, maintenance thereof is difficult because of the inherent tendency of the modulating circuit parameters to drift. The undesirable effect of such parameter value drifting is that an unwanted output signal is produced in the presence of a switching signal and in the absence of an input signal. The magnitude of the unwanted signal output, of course, is related to the amplitude of the switching signal input.

It is the general object of the present invention to provide a modulating circuit of the switching type wherein undesired output signals are minimized in the presence of a switching signal and in the absence of an input signal.

Another object of the present invention is to provide a switching modulator wherein the amplitude of the switching signal is related to the amplitude of the input signal.

A further object is to provide a switching modulator wherein the amplitude of the switching signal is proportional to the output signal produced by the modulator.

Another object is to provide a switching modulator characterized by substantially linear response throughout its operating range and by minimum output in the presence of the switching signal and in the absence of an input signal.

These and other objects of the present invention as will appear to those skilled in the art upon a reading of the following specification are accomplished, in an illustrative embodiment, by the provision of a diode-switching modulator of the shunt type. Variable gain amplifying means are provided for the application of a switching signal to the diode modulator. Rectifying and filtering means are included for the extraction of the D.C. component of the output signal produced by the modulator. The extracted D.C. component is then applied to control the gain of the variable gain amplifier whereby the amplitude of the switching signal is made proportional to the amplitude of the modulator output signal.

For a clearer understanding of the present invention, reference should be had to the sole FIGURE which represents a preferred embodiment of the invention. A conventional diode switching modulator of the shunt type is generally represented by the numeral 1. The modulator comprises diodes 2 and 3, balancing resistors 4 and 5 and transformer 6. The center tap of secondary winding 7 of transformer 6 is grounded. An input signal is applied to modulator 1 by means of terminals 8 and resistor 9. The switching signal input to modulator 1 is applied to the primary 10 of transformer 6. The output signal, produced by modulator 1, is coupled to output terminals 11 by condenser 12 and potentiometer 13. The slider 14 of potentiometer 13 is connected to the grid of fixed gain amplifier 15. The signal which is developed at the plate of amplifier 15 is applied via condenser 16 to forward-biased diode 17. The forward bias for diode 17 is developed at the slider of potentiometer 18.

The cathode of diode 17 is coupled to a low pass filter comprising resistor 19 and condenser 20. The D.C. component of the signal appearing at the cathode of diode 17 is extracted by the low pass filter and applied by resistor 21 to the common anode terminal 22 of back-to-back connected diodes 23 and 24.

The switching signal input to modulator 1 is applied to terminals 25 which are coupled via condenser 26 and resistor 27 to the cathode of diode 23. The cathode of diode 24 is coupled by resistor 28, condenser 29 and resistor 30 to the grid of cathode follower 31. The cathode of cathode follower 31 is connected to ground through the primary 10 of transformer 6. Sources of positive potential are applied for the plate energization of amplifier 15 and cathode follower 31 and for the energization of potentiometer 18.

In operation, diode 17 clamps the junction between condenser 16 and resistor 19 to the positive potential appearing at the slider of potentiometer 18. That is, the potential at said junction is prevented from assuming any value which is less positive than that appearing at the slider of potentiometer 18. Condenser 20 charges through resistor 19 to such minimum positive potential in the absence of any signal at the plate of amplifier 15.

Upon the appearance of a signal at the plate of amplifier 15, diode 17 will conductively short out all alternating portions of said signal which are of less potential than the positive potential at the slider of potentiometer 18. Coupling capacitor 16 blocks the D.C. component of the plate signal, leaving only the alternating components impressed across diode 17. The conduction of diode 17 during portions of the signal applied by condenser 16 introduces a net charge on condenser 16 which is extracted as a control voltage by the low pass filter comprising resistor 19 and condenser 20. The potential to which condenser 20 charges is related to the amplitude of the A.C. component of the signal appearing at the plate of amplifier 15. The minimum voltage on condenser 20 is determined by the slider setting at potentiometer 18.

The positive potential of condenser 20 is impressed across diode 23 and resistor 27 and across diode 24 and resistor 28 in the direction tending to cause conduction of diodes 23 and 24. The back-to-back connection of diodes 23 and 24, with respect to the switching signal developed across resistor 27, tends to render one of diodes 23 and 24 nonconductive for each polarity of the alternately reversing switching signal. Inasmuch as the potential of condenser 20 tends to render diodes 23 and 24 conductive and the potential of resistor 27 tends to render diodes 23 and 24 nonconductive, conduction of the diodes results only when the magnitude of the condenser voltage exceeds the magnitude of the resistor voltage. In this way, diodes 23 and 24 operate to clip the peak-to-peak amplitude of the switching signal inversely as a function of the amplitude of the voltage appearing across condenser 20.

As previously mentioned, the setting of potentiometer 18 establishes the minimum positive potential of condenser 20 which occurs in the absence of a signal at output terminals 11. The minimum positive potential permits a minimum of switching signal to pass diodes 23 and 24 for the excitation of primary 10 of transformer 6. Potentiometer 13, which varies the amplitude of signal drive to amplifier 15, is set in accordance with the desired ratio of switching signal amplitude to input signal amplitude.

Actually, the settings of both potentiometers 13 and 18 determine the amplitude of the switching signal at the primary 10 of transformer 6. However, the setting of potentiometer 18 alone determines the minimum switching signal amplitude. Therefore, the slider of potentiometer 18 is first set in accordance with the minimum switching voltage desired and then potentiometer 13 is set to produce a predetermined ratio between the switching and input signal amplitude.

It will be recognized that although regenerative feedback is utilized to control the amplitude of the switching signal, the stability of the modulator is not adversely affected. This follows from the fact that the output of the diode modulator must be less than the output of an ideal modulator having instantaneous switching at the beginning and end of each half cycle. The conducting angle during which the modulator is shorting the input signal is determined by the ratio of the peak sinusoidal excitation to the amplitude of the signal being commutated. Above ratios of 1:1 the output of the modulator becomes asymptotic to the output of an ideal switch and the incremental gain of the system becomes progressively smaller. Thus, while positive feedback is used, the output does not become divergent, but is rather clamped to the level of the input signal because of the self-limiting characteristics of the modulator. It should also be noted that the gain of the diode modulator with respect to the switching signal is considerably less than one. That is, even in the absence of input signal, a given increase in the amplitude of the switching signal results in an increase at the output of the modulator only to the extent that the modulator is unbalanced with respect to the switching signal.

By reason of the regenerative feedback, a substantially fixed predetermined ratio between the switching and input signal amplitudes is maintained throughout the range of variation of the carrier signal amplitude. The maintenance of a predetermined ratio such as at least five to one assures that the switching operation of diodes 2 and 3 is always under the exclusive control of the switching signal and unaffected by the input signal. The result is that the amplitude of the output signal developed at terminal 11 is substantially lineally related to the amplitude of the input signal irrespective of switching signal amplitude variations. At the same time, excessive switching signal amplitude is avoided when the input signal amplitude approaches a null. Thus, minimum null unbalance signal is produced at output terminals 11 without sacrifice in the linearity of response of modulator 1.

It will be recognized that although the preferred embodiment of the present invention has been disclosed in connection with a shunt type modulator, it is equally applicable to series type switching modulators and to demodulators wherein the input and switching signals are both of the same frequency and of predetermined mutual phase. In short, the preferred embodiment is readily adaptable to all switching types of modulators and demodulators wherein the output signal amplitude is solely a function of the amplitude of the input signal as opposed to being a function of the relative phase between the input and switching signals. Accordingly, the word "modulator" is employed in the appended claims in the broad sense of including modulators and demodulators.

While the invention has been described in its preferred embodiments, it is understood that the words which have been used are words of description rather than of limitation and that changes within the purview of the appended claims may be made without departing from the true scope and spirit of the invention in its broader aspects.

What is claimed is:

1. A variable excitation modulator comprising a switching modulator, an input signal source coupled to said switching modulator, a switching signal source, means coupled to said switching signal source for varying the amplitude of said switching signal in a direct relationship with the amplitude of a control signal, said means for varying applying said switching signal to said modulator, said modulator producing an output signal having an amplitude varying in a direct and substantially linear relationship with the amplitude of said input signal irrespective of any excess in the proportion of said switching signal above a fixed switching signal to input signal ratio, means including a rectifier and a low-pass filter coupled to receive said output signal for producing said control signal, said control signal having an amplitude varying in a direct relationship with the amplitude of said output signal and means for applying said control signal to said means for varying.

2. A variable excitation modulator as defined in claim 1 wherein said means including said rectifier and said low-pass filter includes means for limiting the minimum value of said control signal.

3. A variable excitation modulator as defined in claim 1 and further including means for coupling a controllable portion of said output signal to said means including said rectifier and said low-pass filter.

4. A variable excitation modulator as defined in claim 1 wherein said means for varying comprises a diode peak-to-peak clipper including a pair of diodes having one pair of common terminals interconnected, the other terminals interconnecting said switching signal source to said switching modulator, said control signal being applied to said interconnected common terminal pair.

References Cited in the file of this patent

UNITED STATES PATENTS

| | | |
|---|---|---|
| 1,681,972 | Blackwell et al. | Aug. 28, 1928 |
| 2,070,666 | Llewellyn | Feb. 16, 1937 |
| 2,227,505 | Kummerer | Jan. 7, 1941 |
| 2,657,318 | Rack | Oct. 27, 1953 |
| 2,723,346 | Magnuson | Nov. 8, 1955 |
| 2,817,062 | Towner | Dec. 17, 1957 |